United States Patent
Chih et al.

(10) Patent No.: US 10,008,253 B1
(45) Date of Patent: Jun. 26, 2018

(54) ARRAY ARCHITECTURE AND WRITE OPERATIONS OF THYRISTOR BASED RANDOM ACCESS MEMORY

(71) Applicant: Taiwan Semiconductor Manufacturing Company, Ltd., Hsinchu (TW)

(72) Inventors: Yue-Der Chih, Hsin-Chu (TW); Carlos H. Diaz, Mountain View, CA (US); Jean-Pierre Colinge, Hsinchu (TW); Jonathan Tsung-Yung Chang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 15/224,700

(22) Filed: Aug. 1, 2016

(51) Int. Cl.
  *G11C 11/39* (2006.01)
  *G11C 7/18* (2006.01)
  *G11C 8/14* (2006.01)
  *G11C 11/408* (2006.01)

(52) U.S. Cl.
  CPC .............. *G11C 11/39* (2013.01); *G11C 7/18* (2013.01); *G11C 8/14* (2013.01); *G11C 11/4085* (2013.01)

(58) Field of Classification Search
  CPC .... G11C 7/12; G11C 7/18; G11C 8/08; G11C 8/10; G11C 8/14; G11C 7/39
  USPC .... 365/180, 63, 148, 158, 163, 175, 230.06, 365/189.11
  See application file for complete search history.

(56) References Cited

U.S. PATENT DOCUMENTS

| | | | |
|---|---|---|---|
| 7,456,054 B2 | 11/2008 | Bhattacharyya | |
| 8,315,079 B2* | 11/2012 | Kuo | G11C 7/18 365/148 |
| 8,593,854 B1 | 11/2013 | Chih et al. | |
| 8,869,436 B2 | 10/2014 | Tsai et al. | |
| 9,019,743 B2 | 4/2015 | Tsai et al. | |
| 9,023,699 B2 | 5/2015 | Chang et al. | |
| 9,053,781 B2 | 6/2015 | Tsai et al. | |
| 9,076,522 B2 | 7/2015 | You et al. | |
| 9,153,343 B2 | 10/2015 | Chu et al. | |
| 9,196,360 B2 | 11/2015 | Chou et al. | |
| 9,224,470 B1 | 12/2015 | Chiu et al. | |
| 2013/0234094 A1 | 9/2013 | Chang et al. | |
| 2014/0133211 A1* | 5/2014 | Nazarian | G11C 7/062 365/145 |
| 2014/0166961 A1 | 6/2014 | Liao et al. | |
| 2014/0203236 A1 | 7/2014 | Chen et al. | |
| 2014/0264222 A1 | 9/2014 | Yang et al. | |
| 2014/0264233 A1 | 9/2014 | Tu et al. | |
| 2015/0048297 A1 | 2/2015 | Hsieh et al. | |
| 2015/0085558 A1 | 3/2015 | Chang et al. | |
| 2015/0109849 A1 | 4/2015 | Tsai et al. | |
| 2015/0109850 A1 | 4/2015 | Chang et al. | |
| 2015/0138881 A1 | 5/2015 | Taylor | |

(Continued)

*Primary Examiner* — Tan T. Nguyen
(74) *Attorney, Agent, or Firm* — Duane Morris LLP

(57) ABSTRACT

A memory cell includes a plurality of thyristors each having a first end and a second. The memory cell further includes a plurality of bit-lines. Each of the plurality of thyristors are electrically coupled to one of the plurality of bit-lines at a first end. A local word line is electrically coupled to the second end of each of the thyristors. A selector is electrically coupled to the local word line. The selector is configured to selectively electrically couple the local word line to a data line.

18 Claims, 3 Drawing Sheets

(56) References Cited

U.S. PATENT DOCUMENTS

2015/0170741 A1   6/2015  Chih et al.
2015/0269997 A1   9/2015  Lin et al.
2015/0380063 A1  12/2015  Chang et al.

* cited by examiner

ARRAY ARCHITECTURE AND WRITE OPERATIONS OF THYRISTOR BASED RANDOM ACCESS MEMORY

BACKGROUND

Thyristor-based random access memory (TRAM) is a promising solution for embedded applications due to low power (about 1 pA/cell) and high-density capabilities. Current TRAM systems are configured in arrays, such as cross-point arrays comprising thyristors without diodes. In a cross-point array, voltage (IR) drops on the word-line (WL) for wide-input/output (TO) may impact read speed and write efficiency. In current TRAM architectures, a write voltage may crash, i.e., may not have sufficient write voltage. Writing multiple bits in parallel causes some of the bits to be written to a high current state earlier than other bits. In current designs, the early-write cells are not current limited and may draw too much current on the word-line, causing a voltage drop (delta V=IR) on the word-line. As a result, the write operation of the remaining cells will be impacted due to the drop in write voltage on the word-line. A TRAM element is typically biased at a high current during a write operation and current spikes can occur.

TRAM elements During a write operation, the resistance of a thyristor is changed between a high resistance phase (generally corresponding to a logic "0") and a low resistance phase (generally corresponding to a logic "1") in response to electrical current signals supplied via the word-line and the bit-line. Transitions between a high-resistance phase and a low resistance phase occur when suitable current bias signals are applied to the word-line and/or the bit-line to forward bias a thyristor. The biasing current of the word-line is applied through each cell simultaneously during a write operation. Writing multiple bits on a single word line row causes the current in each of the cells of a row to increase. After the write operation, a voltage crash occurs due to the high current developed on the word-line 18 due to multiple cell writes. As current increases, the voltage on the line also increases and then suddenly drops after a certain amount of current is reached. The more writes performed on a single word line, the greater the voltage (IR) drop.

BRIEF DESCRIPTION OF THE DRAWINGS

Aspects of the present disclosure are best understood from the following detailed description when read with the accompanying figures. It is noted that, in accordance with the standard practice in the industry, various features are not necessarily drawn to scale. In fact, the dimensions of the various features may be arbitrarily increased or reduced for clarity of discussion.

DETAILED DESCRIPTION

Figure 1:
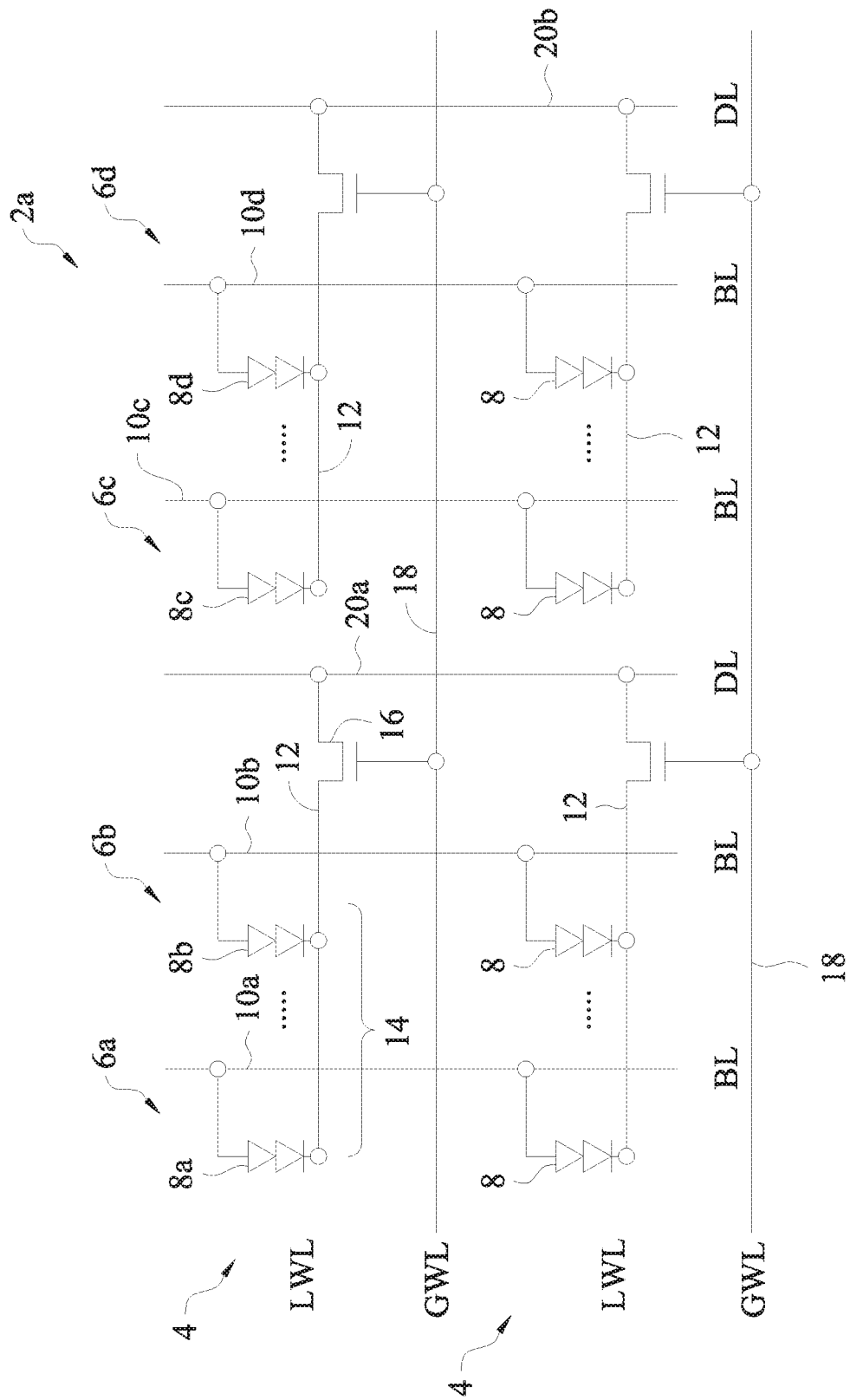
FIG. 1 illustrates one embodiment of a TRAM array, in accordance with some embodiments.
Figure 2:
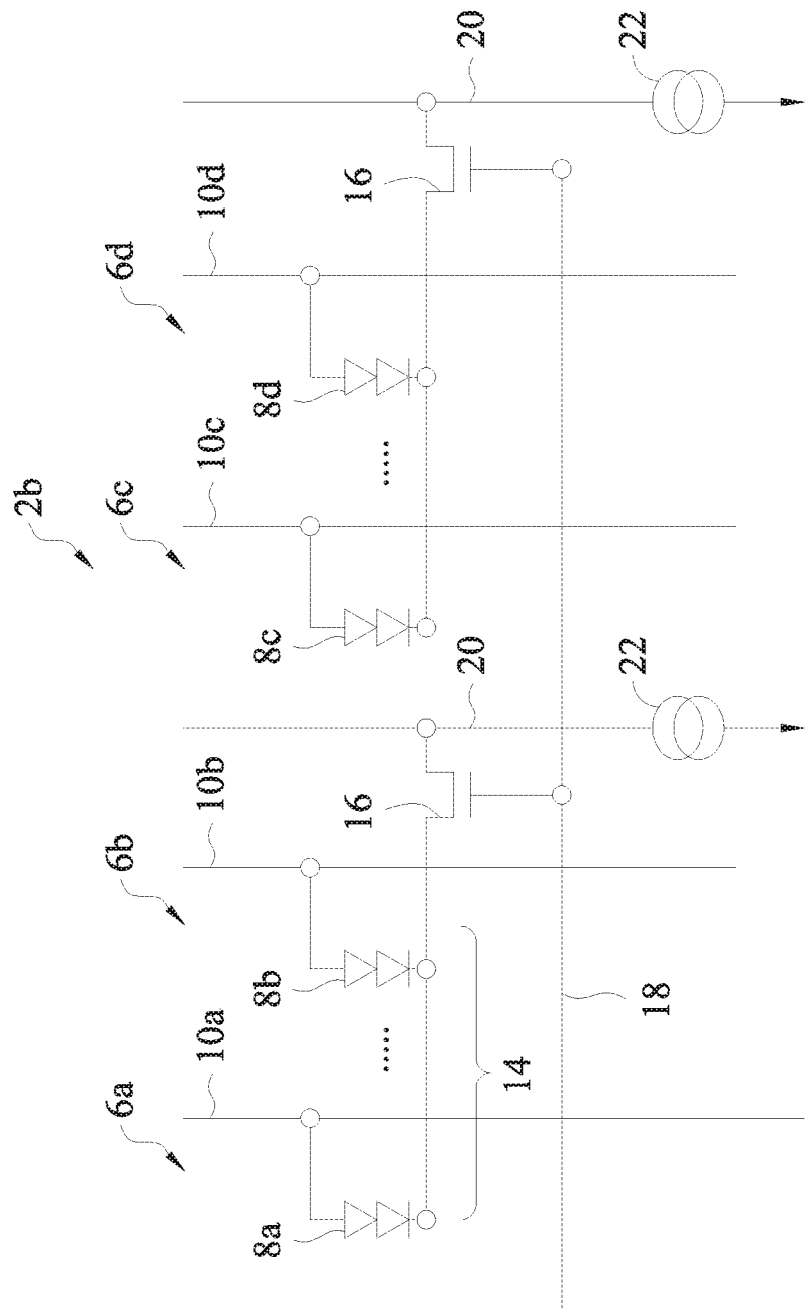
FIG. 2 illustrates one embodiment of a TRAM array having a current limiter coupled to a data line, in accordance with some embodiments.

The following disclosure provides various embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In various embodiments, an array of thyristor-based random access memory (TRAM) elements arranged in a plurality of cells and having a single selector associated with each cell is disclosed. The array includes a plurality of cells. Each of the cells includes a predetermined number n of TRAM elements. Each of the TRAM elements are coupled to individual column bit-lines. Each of the TRAM elements in a cell are coupled to a local word line (LWL). Each of the local word-lines are coupled to one of a plurality of data lines. A selector is coupled between the local word-line and the associated data line. In some embodiments, operation of the selector is controlled by a global word line (GWL). The selector controls the cell such that a write operation is limited to a predetermined number of TRAM elements per data line during a word-line write operation. In some embodiments, each data line of the TRAM array includes a current limiter.

FIG. 1 illustrates one embodiment of a TRAM array 2a. The TRAM array 2a includes a plurality cells 14 arranged in one or more rows 4. Each of the cells 14 includes a predetermined number n of TRAM elements 6a-6d (collectively TRAM elements 6). Each TRAM element 6 includes a thyristor 8 coupled to a bit-line 10 at a first side, such as an anode-side. Each of the bit-lines 10 extend across multiple rows 4 of the array 2a and are coupled to one TRAM element 6 per row. TRAM elements Each n-thyristor cell 14 includes a local word-line (LWL) 12, for selecting the TRAM elements 6 within a specific cell 14. TRAM elements In some embodiment, the LWL 12 is coupled to the thyristor 8 of each of the TRAM elements 6 at a second side of the thyristor 8, for example a cathode side. The bit-line 10 and the LWL 12 of each TRAM element 6 are selectively biased to perform one or more read/write operations on the TRAM elements 6. In some embodiments, each of the cells 14 includes a single selector 16 associated therewith, as described in greater detail below (i.e., each of the cells 14 is an n-thyristor, single-selector cell).

Read and write operations of a TRAM element 6 are performed in similar fashion as read and write operations of a static random-access memory (SRAM) cell. For example, a write operation on a first TRAM element 6a can be performed by biasing a bit-line 10a associated with the first TRAM element 6a and a local word line 12 of the cell 14 associated with the selected TRAM element 6a. The bit line 10a is biased at a predetermined bias voltage and the local word line 12 is biased at a predetermined bias current. In some embodiments, the thyristor 8 can be programmed with a volatile logic state. For example, if the current flowing through the thyristor 8 exceeds a predetermined critical switching charge ($Q_{CR}$), the thyristor 8 is programmed with a volatile logic "1" state. Similarly, if the current flowing through the thyristor 8 is less than a holding charge $Q_H$, the thyristor 8 is programmed with a volatile "0" charge. In some embodiments, the thyristor 8 can be programmed with non-volatile logic states. For example, if the current applied to the thyristor 8 exceeds a predetermined melting current (e.g., a current value that causes a phase change material of the thyristor 8 to transition to a liquid phase), a phase change material of the thyristor 8 is transitioned to a high resistance state, corresponding to a non-volatile logic "0." Similarly, if the current applied to the thyristor 8 is equal to a recrystallizing current (a current that causes a phase change material of the thyristor 8 to transition to a solid phase), the phase change material of the thyristor 8 is transitioned into a low resistance state, corresponding to a non-volatile logic "1." The predetermined melting current and recrystallization current depends on the phase change material of the thyristor and would be well-known to one skilled in the art. Although specific logic schemes are disclosed herein, it will be appreciated by those skilled in the art that any suitable logic scheme can be applied by the array 2a.

In some embodiments, the LWL 12 of each of the cells 14 is coupled to a selector 16. The selector 16 is configured to selectively enable write operations of the cell 14. The selector 16 can be coupled to a global word-line 18 (GWL) and a data line 20. The GWL 18 extends along and is coupled to each selector 16 in a row 4 of cells 14. The data line 20 extends across and is coupled to each of the cells 14 arranged in a column. The data line 20 is configured to provide a write current to one or more cells 14. In some embodiments, the data line 20 is limited to a predetermined maximum current. The selector 16 can include a transistor having a gate coupled to the GWL 18, a source coupled to the data line 20, and a drain coupled to the LWL 12. The transistor can be any suitable transistor such as, for example, a MOSFET, a bipolar junction transistor, and/or any other suitable transistor.

In some embodiments, the selectors 16 control operation of the cells 14 such that only a single element current is generated in each cell 14 (e.g., on each LWL 12) during a write operation. In contrast to a traditional TRAM array, the TRAM array 2a generates a current for writing to a thyristor 8 locally on the data line 20 and LWL 12 (as compared to generating the necessary current globally on the word-line 18 in FIG. 1). Because a current is generated locally, each data line 20 is required to generate only a current sufficient to change the resistive state of a single TRAM element 6, reducing the current generated at each TRAM element 6 and eliminating voltage crashes after a write operation.

A write operation of a TRAM element 6a includes applying a predetermined voltage bias signal to a first side of the thyristor 8a via a bit line 10a and a predetermined current bias signal to the second side of the thyristor 8a via a data line 20a. A control bias signal is applied to the GWL 18a. The control bias signal on the GWL 18 turns on each of the selectors 16 in a selected row 4, connecting the LWL 12 of each cell 14 to an associated data line 20. The predetermined current bias signal is applied to the second side of the thyristors 8a, 8b by the LWL 12. When the bit-line 10a and the LWL 12 corresponding to a TRAM element 6a are biased simultaneously, a write operation is performed. If the bit line 10b of a TRAM element 6b is not biased by a biasing voltage when a cell current is applied to the LWL 12, no change occurs in the TRAM element 6b (e.g., no change in logic value, so the non-biased TRAM element 6b maintains the previously stored logic value (if any) during read/write operations to other TRAM elements 6a in the cell 14).

In some embodiments, the thyristor 8a is configured in a high resistance state corresponding to a non-volatile "0" bit value by applying a suitable bias signal to produce a phase change in the thyristor 8 and a low resistance state corresponding to a non-volatile "1" bit value by applying a suitable bias signal to cause recrystallization of the phase change material. Although specific embodiments are discussed herein, it will be appreciated that the thyristor 8a can be configured in any suitable volatile and/or non-volatile state corresponding to a logical "1" or a logical "0."

Because only a single element 6a-6d current is developed on each of the data lines 20, the array 2a can be configured to write to multiple elements 6a-6d simultaneously without generating a voltage crash. In some embodiments, the number of cells 14 that can be written simultaneously corresponds to the number of data lines 20 in the array 2a. For example, in various embodiments, the array 2a can have a number of data lines 20 equal to $2^X$, where X is a positive integer (e.g., $2^6$, $2^7$, $2^8$, $2^9$, etc.) and can simultaneously write to a number of elements 6a-6d equal to $2^X$, wherein each elements 6a-6d is associated with a different data line 20. In other embodiments, the array 2a can be configured to perform simultaneous write operations to a lesser or greater number of elements 6a-6d. For example, in some embodiments, the array 2a can perform a simultaneous write operation to two or more TRAM elements 6a, 6b within an cell 14. The number of TRAM elements 6a, 6b written simultaneously within the cell 14 can be limited to a predetermined number m to prevent a voltage crash on the LWL 12. In some embodiments, the predetermined number m of TRAM elements is equal to the number of TRAM elements n in the cell 14.

Figure 3:
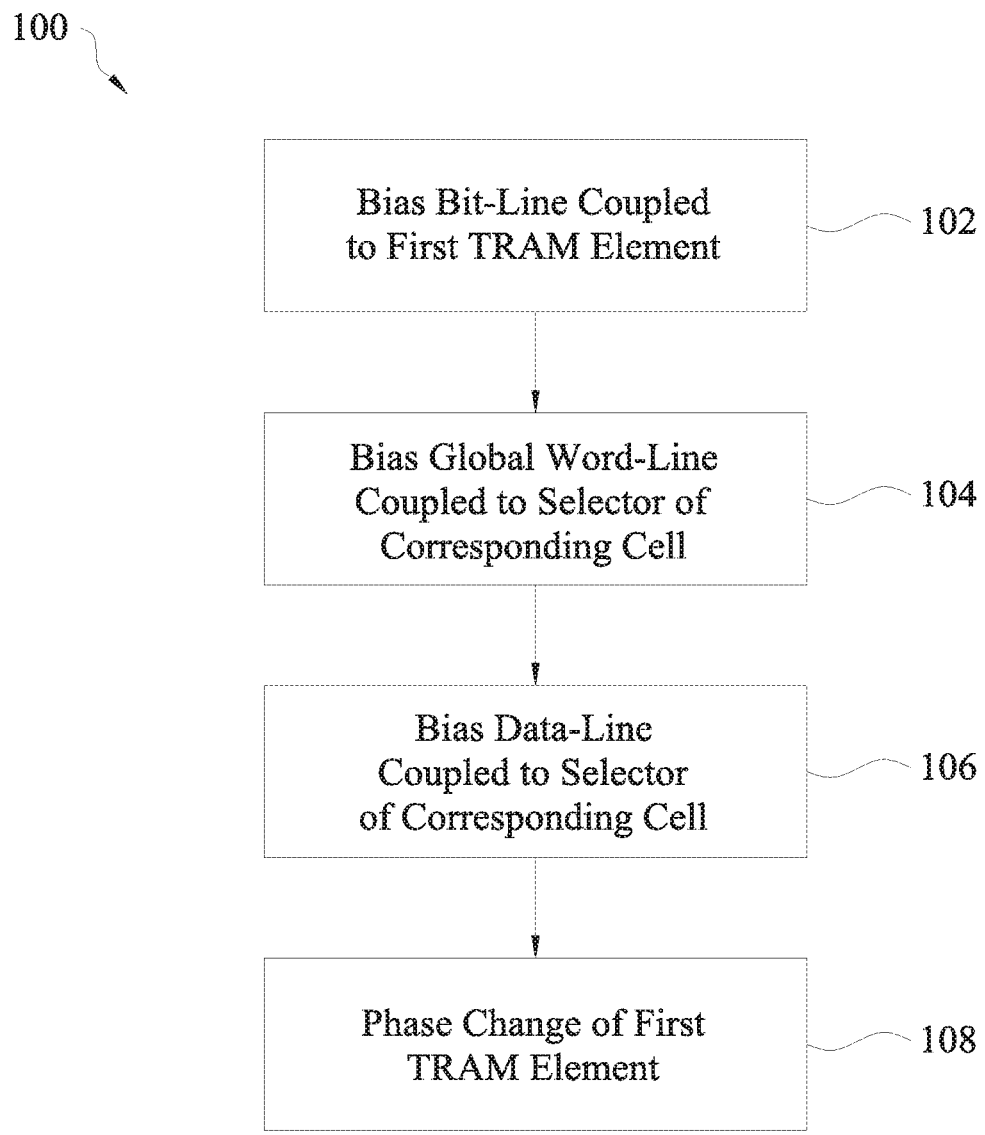
FIG. 3 is a flowchart illustrating a method of operation of a TRAM array, in accordance with some embodiments.

In some embodiments, a maximum current of the data lines 20 is limited to prevent damage to the thyristors 8 and/or the bit lines 10 due to a current spike on the data line 20. FIG. 3 illustrates one embodiment of an array 2b having configured to limit the current generated by each of the data lines 20. In some embodiments, a control bias voltage on the GWL 18 is selected to limit the maximum write current of the local word line 12 in each of the cells 14. For example, in the illustrated embodiment, the selector 16 is a transistor having a gate coupled to the GWL 18 and a source coupled to the data line 20. The control bias voltage on the GWL 18 generates specific gate voltage (e.g., the control bias voltage) that limits the voltage/current that can flow from the source of the selector 16 to the drain of the selector 16. Values that exceed the gate voltage cause the selector 16 to transition to an off state and stop current flow through the local word line 12. Therefore, the current is limited by the gate biasing voltage of the GWL 18. In some embodiments, the gate voltage is selected to limit the maximum current of the data line 20 to a predetermined current, such as, for example, a current sufficient to transition a single TRAM element 6a from a first state (e.g., low resistance) to a second state (e.g., high resistance) (i.e., a single-cell current). As another example, the predetermined current value can be greater than a single-cell current but less than a current sufficient to transition two TRAM elements 6a, 6b during a single write operation.

In some embodiments, a maximum current of each of the data lines 20 is limited by a current limiter 22. The current limiter 22 is coupled to the data line 20, for example, between the data line 20 and a ground and/or a bias current source (not shown). The current limiter 22 can be configured to limit the maximum current of the data line 20 to a predetermined current, such as, for example, a current sufficient to transition a single TRAM element 6a from a first state (e.g., low resistance) to a second state (e.g., high resistance) (i.e., a single-cell current). As another example, the predetermined current value can be greater than a single-cell current but less than a current sufficient to transition two TRAM elements 6a, 6b during a single write operation. Although various predetermined current values are discussed herein, it will be appreciated by those skilled in the art that the current limiter 22 and/or the selector 16 can limit the data line to any suitable predetermined current.

In some embodiments, the current limiter 22 comprises a current mirror. The current mirror is coupled to a reference current (not shown). The reference current is set a predetermined level, such as, for example, a single-cell current. The current mirror limits the maximum current of the data line 20 to the predetermined level of the reference current.

FIG. 3 is a flowchart illustrating a method 100 writing to a TRAM array 2a, in accordance with some embodiments. At step 102 a bias voltage is applied to a bit-line 10a associated with one or more TRAM elements 6a to be written. The first bias voltage is a predetermined voltage configured to transition the thyristor 8 of the TRAM element 6a from a first state to a second state. The second state can be indicative of a binary bit, such as a 0 or 1. At step 104, a second bias voltage is applied to a global word-line 18 associated with one or more of the selected TRAM elements 6a. The second bias voltage has a predetermined voltage value configured to activate one or more selectors 16 associated with the TRAM element 6a to be written. For example, in some embodiments, the selector 16 is a transistor having a gate coupled to the global word line 18. The second bias voltage provides a gate voltage configured to activate the selector 16 and/or to limit current flow from the data line 20a coupled to the selector 16.

At step 106, a third bias voltage is applied to a data line 20a coupled to a selector 16 associated with the TRAM cell 6a to be written. The third bias voltage is a predetermined voltage corresponding to a maximum number of TRAM elements 6a to be written during the write operation. For example, in some embodiments, the data line 20a voltage is a predetermined voltage value greater than a single TRAM element 6a write voltage but less than the write voltage for two TRAM elements 6a, 6b. Simultaneous biasing of the global word-line 18 and the data line 20a causes the third biasing current to flow on the local word-line 16. At step 108, the simultaneous biasing of the bit-line 10a and the local word-line 16 causes a phase-change of the thyristor 8, writing the bit on the bit-line 10a to the thyristor 8.

In various embodiments, a memory cell is disclosed. The memory cell includes a plurality of thyristors each having a first end and a second. The memory cell further includes a plurality of bit-lines. Each of the plurality of thyristors are electrically coupled to one of the plurality of bit-lines at a first end. A local word line is electrically coupled to the second end of each of the thyristors. A selector is electrically coupled to the local word line. The selector is configured to selectively electrically couple the local word line to a data line.

In various embodiments, a memory array is disclosed. The memory array includes a plurality of cells. Each of the cells includes a plurality of thyristors each having a first end and a second, a plurality of bit lines, and a local word line. The first end of each of the thyristors is coupled to one of a plurality of bit lines. The second end of each of the thyristors is electrically coupled to the local word line. A selector is electrically coupled to the local word line and a data line. The selector is configured to selectively couple the local word line to the data line. One or more a global word lines are coupled to the selector in each of a subset of the plurality of cells.

In various embodiments, a method of writing to a TRAM cell is disclosed. The method includes biasing a first bit-line electrically coupled to a first thyristor, biasing a global word-line associated with a first cell containing the first thyristor, wherein the global word-line is electrically coupled to a selector of the first cell, and biasing a data line electrically coupled to the selector. Simultaneous biasing of the first-bit line, the global word-line, and the data line causes a phase change in the first thyristor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
  a plurality of thyristors each having a first end and a second end;
  a plurality of bit-lines, wherein each of the plurality of thyristors is electrically coupled to one of the plurality of bit-lines at the first end;
  a local word line electrically coupled to the second end of each of the thyristors;
  a selector electrically coupled to the local word line, wherein the selector is configured to selectively electrically couple the local word line to a data line configured to provide a predetermined current to the local word line; and
  a current limiter electrically coupled to the data line, wherein the current limiter is configured to limit a maximum current on the data line.

2. The memory cell of claim 1, wherein the selector is electrically coupled to a global word line, and wherein the global word line is configured to control the selector.

3. The memory cell of claim 2, wherein the selector comprises a transistor device having a gate coupled to the global word line, a source coupled to the data line, and a drain coupled to the local word line.

4. The memory cell of claim 2, wherein the global word line is configured to limit a maximum current of the data line.

5. The memory cell of claim 1, wherein the current limiter comprises a current mirror.

6. A memory array, comprising:
  a plurality of cells each comprising:
    a plurality of thyristors each having a first end and a second end, wherein the first end of each of the thyristors is electrically coupled to one of a plurality of bit lines;
    a local word line electrically coupled to the second end of each of the thyristors;
    a selector electrically coupled to the local word line;
    a data line electrically coupled to the selector, wherein the selector is configured to selectively electrically couple the local word line to the data line, and wherein the data line is configured to provide a predetermined current to the local word line;
  one or more a global word lines, wherein one of the one or more global word lines is electrically coupled to the selector in each of the plurality of cells; and
  a current limiter electrically coupled to the data line.

7. The memory array of claim 6, wherein the selector comprises a transistor having a source coupled to the data line, a gate coupled to the global word line, and a drain coupled to the local word line.

8. The memory array of claim 7, wherein the transistor is configured to limit a maximum current generated on the data line.

9. The memory array of claim 6, wherein the plurality of cells comprises a number of cells equal to $2^X$, where X is a positive integer.

10. The memory array of claim 6, wherein the current limiter is configured to limit the data line to a single thyristor current.

11. The memory array of claim 6, wherein the current limiter comprises a current mirror.

12. The memory array of claim 6, wherein the plurality of cells are arranged in one or more columns and one or more rows.

13. The memory array of claim 12, wherein each data line is coupled to a subset of the plurality of n cells arranged in a column.

14. The memory array of claim 12, wherein each of the global word lines are coupled to a plurality of cells arranged in a row.

15. A method of writing to a TRAM cell, the method comprising:
 biasing a first bit-line electrically coupled to a first thyristor;
 biasing a global word-line associated with a first cell containing the first thyristor, wherein the global word-line is electrically coupled to a selector of the first cell;
 biasing a data line electrically coupled to the selector, wherein simultaneous biasing of the first-bit line, the global word-line, and the data line causes a phase change in the first thyristor.

16. The method of claim 15, wherein limiting a current developed on the data line to a predetermined value.

17. The method of claim 15, comprising:
 biasing a second bit-line electrically coupled to the a second thyristor, wherein the first cell contains the second thyristor, and wherein the simultaneous biasing of the second bit-line, the global word-line, and the data line causes a phase change in the second thyristor.

18. The method of claim 17, wherein the data line is limited to a predetermined current less than a combined phase-change current of the first thyristor and the second thyristor.

* * * * *